(12) United States Patent
Graebner et al.

(10) Patent No.: US 6,222,299 B1
(45) Date of Patent: Apr. 24, 2001

(54) SURFACE ACOUSTIC WAVE DEVICES COMPRISING LARGE-GRAINED DIAMONDS AND METHODS FOR MAKING

(75) Inventors: John Edwin Graebner, Short Hills; Sungho Jin, Millington; Wei Zhu, Warren, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/020,752

(22) Filed: Feb. 9, 1998

(51) Int. Cl.[7] ............................. H03H 9/25; H01L 41/18
(52) U.S. Cl. .................................. 310/313 R; 310/313 A
(58) Field of Search ........................... 310/313 R, 313 A

(56) References Cited

U.S. PATENT DOCUMENTS

| | | | |
|---|---|---|---|
| 5,355,568 | * 10/1994 | Imai | 310/313 R |
| 5,446,329 | * 8/1995 | Nakahata et al. | 310/313 A |
| 5,459,368 | * 10/1995 | Onishi et al. | 310/313 R |
| 5,565,724 | 10/1996 | Hachigo et al. | 310/313 A |
| 5,565,725 | 10/1996 | Nakahata et al. | 310/313 A |
| 5,576,589 | * 11/1996 | Dreifus et al. | 310/313 A |
| 5,646,468 | 7/1997 | Nakahata et al. | 310/313 A |
| 5,652,436 | * 7/1997 | Stoner et al. | 257/77 |
| 5,672,240 | * 9/1997 | Stoner et al. | 156/631.1 |
| 5,776,246 | * 7/1998 | Tanabe et al. | 117/89 |

(List continued on next page.)

FOREIGN PATENT DOCUMENTS 5-95249 * 4/1993 (JP) .................................. 310/313 R

OTHER PUBLICATIONS

Felman, M., Henaff, J. "Surface Acoustic Waves For Signal Processing" Book, Chapter 4, *Piezoelectric Transducers*, Artech House, Publisher, Boston 1996.

Nakahata, H., Higaki, K., Hachigo, A., Shikata, S., Fujimori, N., Takahash, Y, Kajihara, T., and Yamamoto, Y., "High Frequency Surface Acoustic Wave Filter Using ZnO/Diamond/Si Structure", *Jpn. J. Appl. Phys.*, vol. 33 (1994), pp. 324–328, Part 1, No. 1A, Jan., 1994.

Shikata, S., Nakahata, H., Higaki, K., Fujii, S., Hachigo, A., Kitabayashi, H., Seki, Y., Tanabe, K. and Fujimori, N., "Saw Filters Based On Diamond", *Applications of Diamond Films and Related Materials: Third International Conference*, 1995, pp. 29–36.

Taguchi, Y, Seki, S., Onishi, K., and Eda, K., "A New Balanced–Unbalanced Type RF–Band SAW Filter" *1996 IEEE Microwave Theory and Technology Conference Proceedings*, 6/96, pp. 417–420.

Weigel, R., Weigenthaler, Dill, R., and Schropp, I., "A 900 MHZ Ladder–Type Saw Filter Duplexer", *1996 IEEE Microwave Theory and Technology Conference Proceedings*, 6/96, pp. 413–416.

Hartmann, C. and Wilkus, S., "Surface Acoustic Wave Bandpass Filters", *Proceedings 37th Annual Frequency Control Symposium*, 1993, p. 354–360.

*Primary Examiner*—Thomas M. Dougherty
(74) *Attorney, Agent, or Firm*—John M. Harman

(57) ABSTRACT

Embodiments of the invention include an improved diamond-based surface acoustic wave (SAW) filter device. The SAW device comprises polished, large-grained diamond in combination with a piezoelectric layer to enhance the acoustic velocity and operational frequency of the SAW device with reduced loss and increased efficiency. Also, the use of a pre-polished, large-grained diamond slab reduces processing complications such as contamination or stressing of delicate device circuitry adjacent to the diamond component. Alternative embodiments of the invention include planar or vertical interconnection schemes for packaging of the SAW device and also include planarization schemes for convenient deposition and patterning of the SAW device metallization layer.

15 Claims, 3 Drawing Sheets

U.S. PATENT DOCUMENTS

| | | | |
|---|---|---|---|
| 5,838,090 | * 11/1998 | Nakahata et al. | 310/313 A |
| 5,872,415 | * 5/1999 | Dreifus et al. | 310/311 |
| 5,907,768 | * 5/1999 | Malta et al. | 438/105 |
| 6,078,229 | * 6/2000 | Funada et al. | 333/193 |

* cited by examiner

SURFACE ACOUSTIC WAVE DEVICES COMPRISING LARGE-GRAINED DIAMONDS AND METHODS FOR MAKING

BACKGROUND OF THE INVENTION

1. Field of the Invention

The invention relates to surface acoustic wave (SAW) devices. More particularly, the invention relates to SAW devices, having diamond films, used in high frequency operations.

2. Description of the Related Art

Surface acoustic wave (SAW) devices are useful, e.g., for filtering unwanted frequency signals, for providing signal delay lines, and for generating high frequency oscillations in telecommunication and other apparatus and systems. SAW devices typically include a smooth piezoelectric substrate such as quartz, lithium niobate ($LiNbO_3$) or lithium tantalate ($LiTaO_3$), and an inter-digital-transducer (IDT) having a set of alternating or interpenetrating finger-shaped electrodes formed on the piezoelectric substrate surface. The electrodes are driven by a radio frequency (RF) source. A portion of the electrode pattern includes the input transducer, which converts an incoming electrical signal appearing across the input terminals to an alternating electric field and consequently to an acoustic wave traveling along the surface of the piezoelectric substrate. The surface acoustic wave is sampled continuously by another IDT acting as an output transducer.

SAW devices having frequency-selective elements are used as acoustic filters, with the sound radiation of certain frequencies being transmitted through the pass-band structure while other frequencies are attenuated. SAW filters typically are of a resonator type or a transversal type, depending on the device structure and the mode of operation.

Descriptions of SAW devices are included in articles such as C. Hartman and S. Wilkus, "Proc. 37$^{th}$ Annual Frequency Control Symposium", 1993, p. 354; R. Weigel et al., "Proceedings 1996 IEEE Microwave Theory and Technology Conference", June 1996, Paper No. WE1A-4, p. 413; Y. Taguchi et al., "Proceedings 1996 IEEE Microwave Theory and Technology Conference", June 1996, Paper No. WE1A-5, p. 417. These articles hereby are incorporated by reference herein. Also, a discussion of conventional SAW devices is included in the book M. Feldmann and J. Henaff, *Surface Acoustic Waves for Signal Processing*, Artech House, Boston, 1996, chapter 4.

A filter using a SAW device has a theoretical maximum filtering response at the signal frequency $f=v_p/\lambda$, where $v_p$ is the acoustic phase velocity of the sound-transmitting medium and $\lambda$ is the geometric spacing in the IDT fingers. Diamond has a relatively high acoustic velocity, i.e., greater than 11,000 m/sec, and hence allows SAW devices incorporating diamond to be operated at higher frequencies. The use of diamond films as substrates for SAW devices is disclosed generally in articles such as Nakahata et al., "High Frequency Surface Acoustic Wave Filter Using ZnO/Diamond/Si Structure", Japan. Journal of Appl. Phys. Vol. 33, 324 (1994); and Shikata et al., "SAW Filters Based on Diamond", Proc. Applied Diamond Conf. 1995, Applications of Diamond Films and Related Materials, p. 29. Because diamond is not piezoelectric, an additional layer of piezoelectric material typically is used in SAW devices having diamond film substrates.

Although single crystal diamond films or high-quality heteroepitaxially-grown diamond films often are desirable, producing such films over a large area with convenient, relatively low-cost processing is not commercially available at present. Therefore, conventional SAW devices comprising diamond use relatively thin chemical vapor deposition (CVD) diamond films deposited directly on a silicon (Si) substrate. Such diamond films typically are thin, e.g., no more than approximately 50 microns ($\mu$m), and typically exhibit a very fine grain size, e.g., approximately 1–5 $\mu$m. See, for example, the article Graebner et al., "Large Anisotropic Thermal Conductivity in Synthetic Diamond Films", Nature, vol. 359, 401 (1992).

However, the deposition of a thin, fine-grained diamond film directly on a silicon substrate, as is done with conventional diamond SAW devices, induces additional complications of having to polish the rough diamond film surface, which often contaminates and/or stresses the delicate silicon device circuitry and associated components. Furthermore, the grain boundary area in diamond films is a disturbed surface and therefore is a source of acoustic wave attenuation, which causes a loss of efficiency in wave transmission.

Accordingly, it is desirable to have available a SAW device having large-grained diamond films incorporated therein for greater operating efficiency. Also, it is desirable to have available a convenient method for incorporating large-grained diamond films into SAW devices. Desirably, the diamond films coincide with the integrated circuit (IC) circuitry and the IDT transducer electrode patterns without suffering from conventional grain boundary induced losses and processing complications.

SUMMARY OF THE INVENTION

The invention is embodied in a surface acoustic wave (SAW) device having large-grained diamond in combination with a piezoelectric layer to enhance the acoustic velocity and operational frequency of the SAW device by reducing loss and improving efficiency. The large-grained diamond has a grain size greater than approximately 10 microns ($\mu$m) in average diameter. The grain size typically is at least 30 $\mu$m in average diameter and often is at least 60 $\mu$m in average diameter. The SAW device includes a substrate such as silicon or other suitable material, at least one large-grained diamond positioned on the substrate, at least one piezoelectric layer formed on the large-grained diamond, and at least one inter-digital-transducer (IDT) formed on the piezoelectric layer. Typically, the major surface of the large-grained diamond is substantially planar to the major surface of said substrate. Also, the use of one or more prepolished, large-grained diamond slabs reduces processing complications such as contamination or stressing of delicate device circuitry adjacent to the large-grained diamond. According to alternative embodiments of the invention, the SAW device is used with conventional planarization schemes for convenient deposition and patterning of electrically conducting layers. Also, alternative embodiments of the invention include planar or vertical interconnections of large-grained diamond and the electrodes of the inter-digital-transducer (IDT) formed on the substrate for convenient packaging of the SAW device.

DETAILED DESCRIPTION

Figure 1:
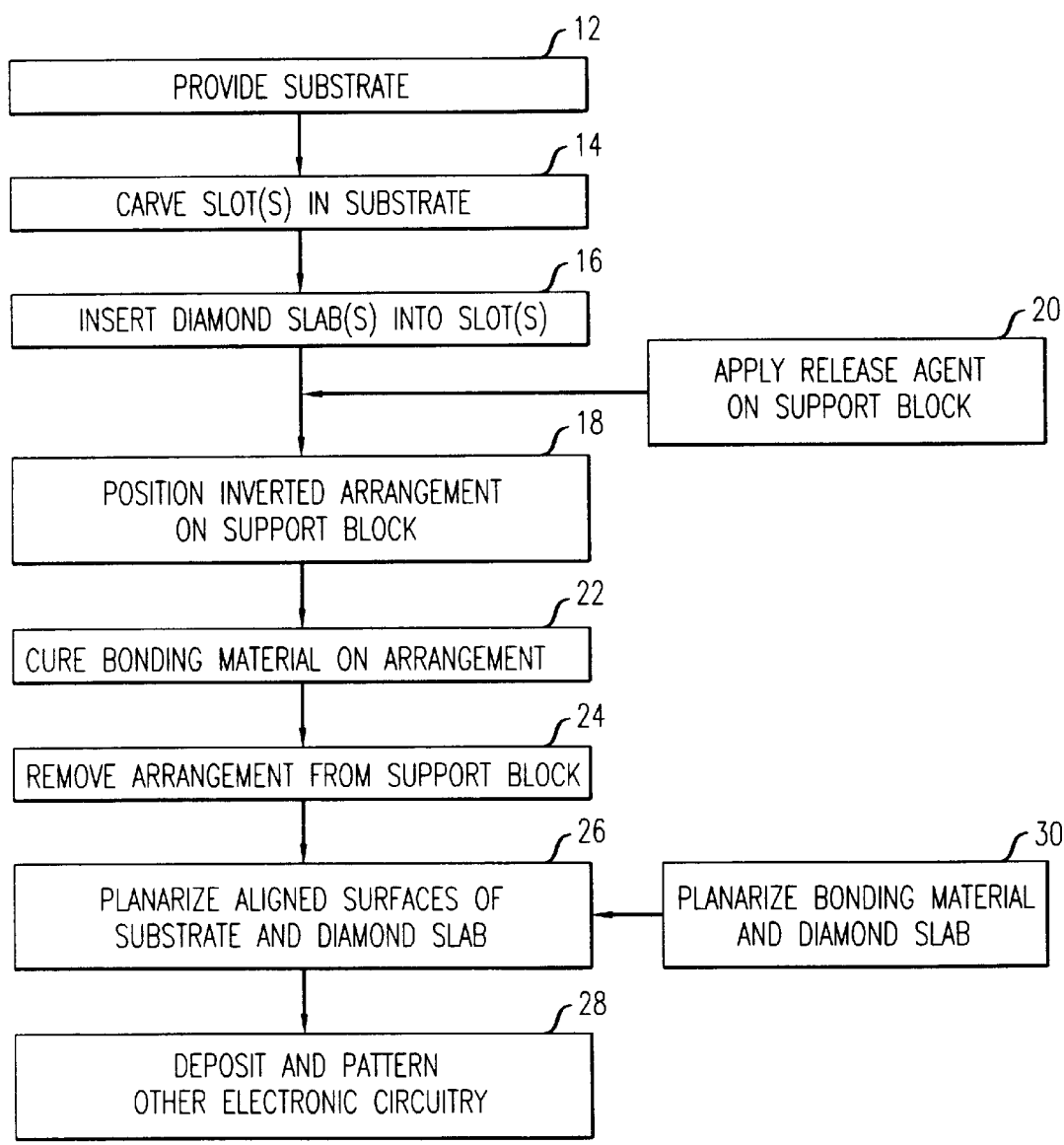
FIG. 1 is a schematic view of a process of incorporating a large-grained diamond into the substrate of a surface acoustic wave (SAW) device according to an embodiment of the invention.

In the following description, similar components are referred to by the same reference numeral in order to enhance the understanding of the invention through the description of the drawings.

Also, although specific features, configurations and arrangements are discussed hereinbelow, it should be understood that such is done for illustrative purposes only. A person skilled in the relevant art will recognize that other steps, configurations and arrangements can be used without departing from the spirit and scope of the invention.

Embodiments of the invention are based on the advantageous realization that the use of large-grained diamonds (typically pre-polished) in combination with a piezoelectric layer within surface acoustic wave (SAW) devices enhances the acoustic velocity and operational frequency of the device while also reducing loss and thus improving efficiency. Improved efficiency is advantageous for SAW devices used, e.g., as high frequency filters, signal delay lines and high frequency oscillators. Furthermore, the use of prepolished large-grained diamond slabs reduces processing complications such as contamination or stress otherwise inflicted upon the delicate circuit components adjacent to the diamond slab.

Figure 2:
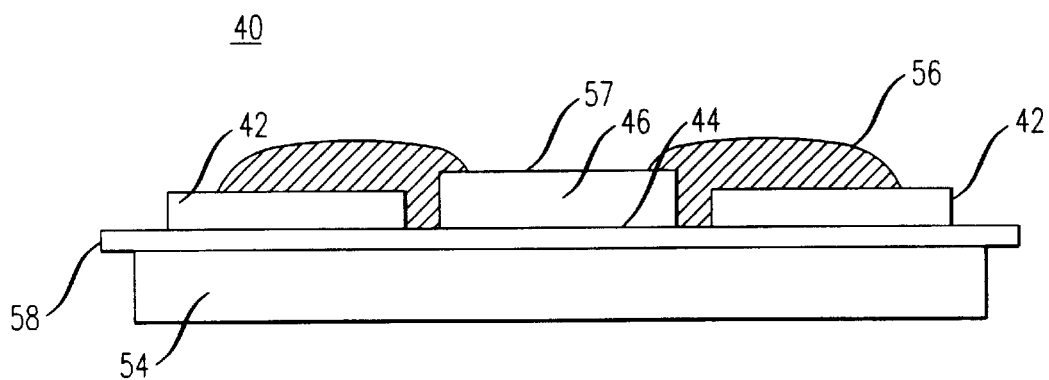
FIG. 2 is a partial cross-sectional side view of a surface acoustic wave (SAW) device according to an embodiment of the invention showing the incorporation of a large-grained diamond and its planarization together with the substrate.

Referring now to FIG. 1, according to embodiments of the invention, an exemplary method for incorporating large-grained diamond into the substrate of a SAW device is illustrated schematically. Also, FIG. 2 illustrates a SAW device 40 during its formation using the method of FIG. 1. In this method, a first step 12 is to provide a substrate 42 for surface acoustic wave (SAW) device 40. Substrate 42 is made of silicon or other suitable material that forms a substrate capable of supporting electronic circuitry, such as gallium arsenide (GaAs), silicon carbide (SiC), gallium nitride (GaN) and aluminum oxide ($Al_2O_3$). Typically, the thickness of substrate 42 is within the range from approximately 100–1000 microns ($\mu$m).

A next step 14 is to carve out one or more slots 44 from substrate 42, e.g., by mechanical cutting or chemical etching. Once slots 44 are formed, another step 16 is to insert one or more diamond slabs 46 into the slots. Alternatively, other materials capable of supporting electronic circuitry or other known diamond SAW devices are positioned within slots 44 alone or with diamond slab 46. Also, for space-saving reasons, other inductive or capacitive components may be positioned therein. According to alternative embodiments of the invention, substrate 42 consists of two or more pieces between which one or more diamond slabs 46 are positioned. As will be discussed in greater detail hereinbelow, diamond slab 46 is a large-grained, pre-polished diamond.

The next step 18 is to invert substrate 42 and diamond slab 46 and place them on a support block 54 having a flat surface to align at least one surface of substrate 42 with at least one side of diamond slab 46. An alternative step 20 includes applying a nonGraebner-Jin-Zhu sticking release paper or release agent (e.g., grease or Teflon spray) on support block 54 prior to placing the inverted arrangement on support block 54.

The next step 22 is to cure a bonding material 56 on the substrate and diamond slab arrangement. Bonding material 56, which typically is made of epoxy, cement, glass, or other suitable electrically insulating material, is applied to bond together substrate 42 and diamond slab 46, as well as to fill gaps therebetween. The gaps between diamond slab 46 and substrate 42 are kept relatively small, typically less than approximately 500 $\mu$m in width, more typically less than approximately 200 $\mu$m in width. Bonding material 56 is cured by conventional drying, solidification or polymerization to secure diamond slab 46 in place within substrate 42.

According to embodiments of the invention, bonding material 56 should be stable enough to allow subsequent high temperature processing of, e.g., silicon device circuits and associated components. Bonding materials according to embodiments of the invention include, e.g., low melting point glasses such as those with melting points near approximately 500° Celsius and/or containing lead oxide ($Pb_3O_4$), cements containing aluminum oxide ($Al_2O_3$), and high-temperature polyimides that withstand temperatures in excess of 300° Celsius.

Alternatively, the surface of diamond slab 46 is processed to promote adhesion with bonding material 56. For example, diamond slab 46 is processed with an adherent interlayer of carbide-forming elements such as titanium (Ti), silicon (Si), tungsten (W), molybdenum (Mo) or alloys containing one or more of these elements. Alternatively, diamond slab 46 is deposited with carbide, nitride or oxide layers such as titanium carbide (TiC) and aluminum oxide ($Al_2O_3$).

The next step 24 is to remove support block 54 from the substrate and diamond slab arrangement. The next step 26 is to polish and planarize the aligned surfaces of the substrate and diamond slab arrangement to allow for the subsequent step 28 of depositing and patterning conductive paths and IDT electrodes (shown in FIG. 3 and described hereinbelow). Polishing is performed, e.g., by mechanical polishing or chemicalmechanical polishing.

Alternatively, a step 30 of polishing bonding material 56 down to the opposite surface of diamond slab 46 (shown as 57) is performed, e.g., for ease of handling. The planarization of the SAW device 40 removes undesirable large steps or discontinuities between adjacent regions of substrate 42 and diamond slab 46. In this manner, circuit connections are provided subsequently via patterned conductors. The reliable integration of SAW device 40 and other electronic circuitry is crucial for efficient operation of the device.

According to embodiments of the invention, diamond slab 46 is a free-standing thick film and has a grain size, e.g., of at least 10 $\mu$m in average diameter, typically at least 30 $\mu$m in average diameter, more typically at least 60 $\mu$m in average diameter. The average diameter is measured, e.g., using a linear intercept method along the horizontal surface along the direction of acoustic wave travel.

For ease of handling and reduction of stress-induced warping, diamond slab 46 is, e.g., at least 50 $\mu$m thick, typically at least 100 $\mu$m thick, and more typically at least 200 $\mu$m thick after polishing. Embodiments of the invention typically use the larger-grained, growth-side top surface of a diamond slab during diamond thick-film synthesis. Conventionally, diamond slabs taken from the much finergrained nucleation side, e.g., the bottom side, of CVD diamond films are used.

According to embodiments of the invention, free-standing diamond slabs are obtained by dissolving growth substrates once synthesis of the large-grained diamond slab is complete. Such growth substrates typically are made of molybdenum (Mo) or silicon (Si). The rough, faceted growth surface of the free-standing diamond slab with large grains then is polished smooth and flat, e.g., by mechanical or chemical methods.

Figure 3:
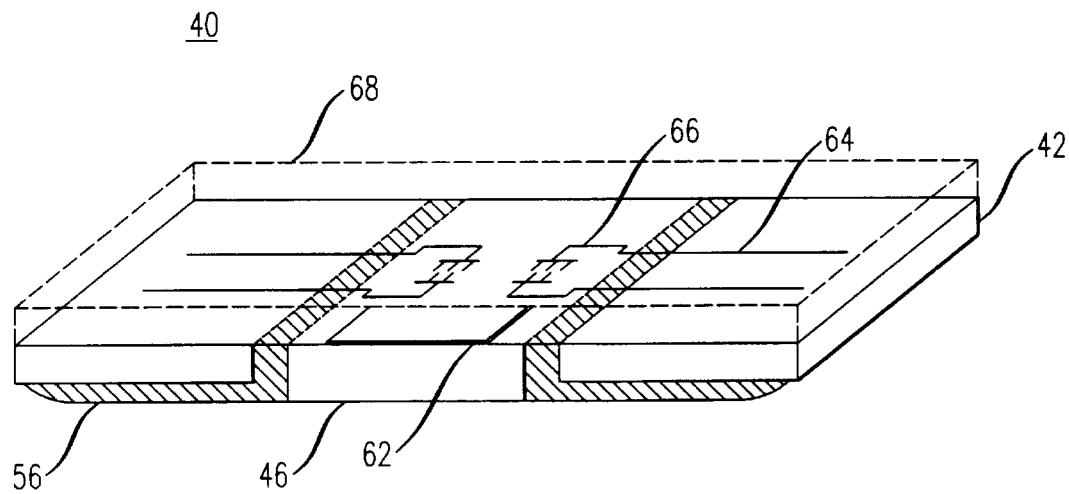
FIG. 3 is a perspective view of the diamond SAW device shown in FIG. 2 during the final steps of device formation.

FIG. 3 illustrates diamond SAW device 40 upon completion of depositing and patterning the conductive paths and IDT electrodes. In addition to substrate 42, diamond slab 46 and bonding material 56, SAW device 40 includes a piezoelectric film or layer 62, at least one patterned IDT transducer electrode 66 and at least one conductor path 64 for connecting patterned IDT transducer electrodes 66 with other IC circuitry (not shown). Piezoelectric layer 62 is made of, e.g., zinc oxide (ZnO), aluminum nitride (AlN), quartz, lithium niobate (LiNbO$_3$), or lithium tantalate (LiTaO$_3$) barium titanate (BaTiO$_3$), lead zirconium titanate Pb(Zr,Ti)O$_3$. IDT transducer electrodes 66 are films or other arrangements made of suitable conducting materials, such as aluminum (Al) or copper (Cu). Also, conducting paths 64 are made of suitable conducting materials, such as aluminum (Al) or copper (Cu) films.

With respect to the IC circuitry, it is possible to process some or all of the IC circuitry prior to or after the insertion of diamond slab 46 into substrate 42 and the planarization of diamond slab 46. For IC circuitry prepared prior to the insertion of diamond slab 46, substrate 42 is coated with a protective coating, which may be removed later. Alternatively, substrate 42 is fabricated to be slightly recessed with respect to diamond slab 46, with the height difference (i.e., the step height) sufficiently small to allow metallization continuity.

Alternatively, piezoelectric layer 62 and the surface of IDT transducer electrodes 66 are protected using an overcoat layer 68 made of, e.g., silicon dioxide (SiO$_2$) or other suitable electrically insulating, environmentally stable materials. In addition to providing protection, such layer is used to adjust the operating frequency of the device, e.g., via stress-induced changes in acoustic velocity of the underlying piezoelectric layer and possibly of diamond.

Figure 4:
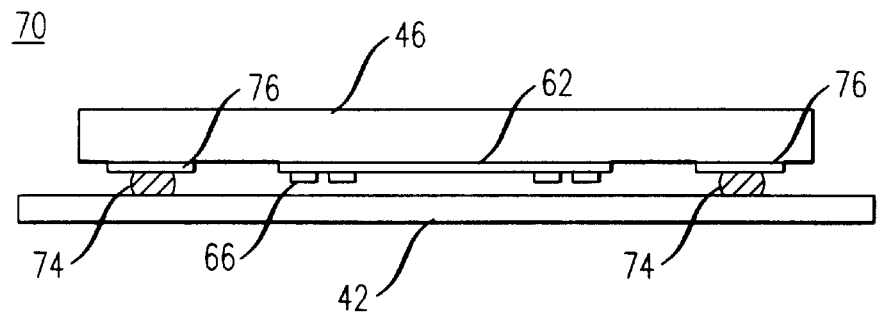
FIG. 4 is a partial cross-sectional side view of a SAW device according to an alternative embodiment of the invention.

Referring now to FIG. 4, a SAW device 70 according to an alternative embodiment of the invention is shown. In this embodiment, SAW device 70 uses vertical interconnections of substrate 42 and IDT transducer electrode 66 rather than the planar interconnections thereof used by embodiments discussed previously herein.

In the embodiment shown in FIG. 4, the piezoelectric layer 62 and the IDT transducer electrodes 66 are formed on the diamond slab 46. However, the IC circuitry, which is formed on substrate 42, is fabricated independently from diamond slab 46. In this embodiment, their electrical interconnection is achieved using, e.g., one or more solder bonds (or wire bonds) 74 between diamond slab 46 and substrate 42. The solder bonds 74 provide electrical connection between the IC circuitry on substrate and IDT transducer electrodes on diamond slab 46. Alternatively, the solder bonds have corresponding contact pads 76 deposited on and adhered to diamond slab 46 and positioned between solder bond 74 and diamond slab 46.

The embodiment shown in FIG. 4 is advantageous, e.g., in that processing cross-contamination or damages of diamond slab 46 and/or the IC circuitry is significantly reduced if not minimized. Such cross-contamination or mechanical damage typically occurs, e.g., during polishing (planarization) of the device shown, e.g., in FIG. 3 or during diffusional heat treatment of the IC circuitry.

Figure 5:
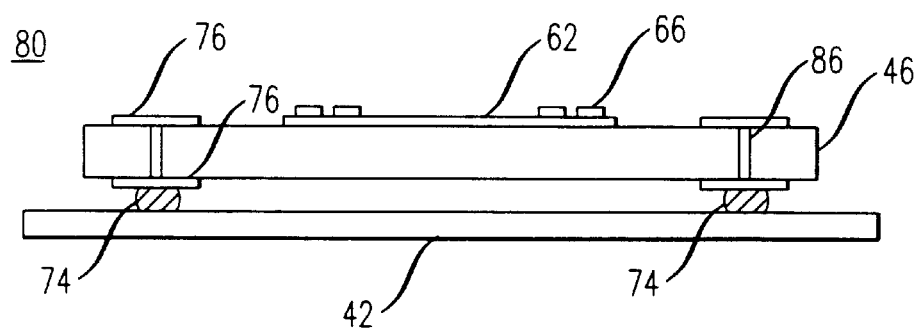
FIG. 5 is a partial cross-sectional side view of a SAW device according to another alternative embodiment of the invention.

Referring now to FIG. 5, a SAW device 80 according to yet another alternative embodiment of the invention is shown. In this embodiment, diamond slab 46 has one or more vias filled or coated with a suitable electrical conducting material (shown generally as 86). The vias are formed, e.g., by laser beam processing. In this manner, the material in vias is electrically connected to one or more contact bond pads 76, which is soldered or wire bonded to the IC circuitry on substrate 42, e.g., in a conventional manner.

According to embodiments of the invention, the use of large-grained diamonds in SAW devices improves the efficiency of the SAW device compared to the insertion loss of conventional SAW devices. For example, the insertion loss, i.e., the reduction of the microwave signal passing through the SAW component of the device, often is defined as Log {transmitted power/incident power} in the unit of decibels. According to embodiments of the invention, the insertion loss is reduced, e.g., by at least 10% and typically by at least 30%. Also, according to embodiments of the invention, the quality factor Q, which is defined herein as Q=f/$\Delta$f, where is the operating frequency of the SAW device and where $\Delta$f is the bandwidth of the signal, is reduced, e.g., by at least 10% and typically by at least 30%.

It will be apparent to those skilled in the art that many changes and substitutions can be made to the embodiments of the surface acoustic wave (SAW) devices herein described without departing from the spirit and scope of the invention as defined by the appended claims and their full scope of equivalents.

What is claimed is:

1. A surface acoustic wave (SAW) device, comprising:
   a substrate having at least one major surface;
   at least one large-grained diamond coupled to said substrate in such a way that a major surface of said large-grained diamond is substantially planar to a major surface of said substrate,
   wherein said substrate and said large-grained diamond are vertically interconnected by at least one solder bond;
   at least one piezoelectric layer formed on said diamond; and
   at least one inter-digital-transducer (IDT) formed on said piezoelectric layer.

2. The device as recited in claim 1, wherein said large-grained diamond has a grain size of at least approximately 10 microns ($\mu$m) in diameter.

3. The device as recited in claim 1, wherein said substrate is made of a material selected from the group consisting of silicon, gallium arsenide (GaAs), silicon carbide (SiC), gallium nitride (GaN) and aluminum oxide (Al$_2$O$_3$).

4. The device as recited in claim 1, wherein said substrate has formed thereon at least one electrically conductive path coupled to said inter-digital-transducer.

5. The device as recited in claim 1, wherein said substrate has electrically conductive circuitry formed thereon and wherein said SAW device further comprises at least one via formed in said large-grained diamond, said via having an electrically conductive path therethrough for electrically coupling said inter-digital-transducer with said circuitry.

6. The device as recited in claim 1, wherein said piezoelectric layer is made of a material selected from the group consisting of zinc oxide (ZnO), aluminum nitride (AlN), quartz, lithium niobate (LiNbO$_3$) and lithium tantalate (LiTaO$_3$).

7. The device as recited in claim 1, further comprising a protective layer formed on at least a portion of said piezoelectric layer and at least a portion of said inter-digital transducer.

8. The device as recited in claim 1, wherein said substrate has a thickness of at least approximately 30 microns ($\mu$m).

9. A surface acoustic wave (SAW) device, comprising:
   a substrate having at least one major surface and having electrically conductive circuitry formed thereon;
   at least one large-grained diamond coupled to said substrate;
   a bonding material formed on at least a portion of said substrate and at least a portion of said diamond in such a way that a major surface of said large-grained diamond is substantially planar to a major surface of said substrate;
   at least one piezoelectric layer formed on said diamond;
   at least one inter-digital-transducer (IDT) formed on said piezoelectric layer; and
   at least one via formed in said large-grained diamond, said via having an electrically conductive path therethrough for electrically coupling said inter-digital-transducer with said circuitry.

10. The device as recited in claim 9, wherein said large-grained diamond has a grain size of at least approximately 10 microns ($\mu$m) in diameter.

11. The device as recited in claim 9, wherein said substrate is made of a material selected from the group consisting of silicon, gallium arsenide (GaAs), silicon carbide (SiC), gallium nitride (GaN) and aluminum oxide ($Al_2O_3$).

12. The device as recited in claim 9, wherein said substrate has formed thereon at least one electrically conductive path coupled to said inter-digital-transducer.

13. The device as recited in claim 9, wherein said substrate has a thickness of at least approximately 30 microns ($\mu$m).

14. The device as recited in claim 9, wherein said piezoelectric layer is made of a material selected from the group consisting of zinc oxide (ZnO), aluminum nitride (AlN), quartz, lithium niobate ($LiNbO_3$) and lithium tantalate ($LiTaO_3$).

15. The device as recited in claim 9, further comprising a protective layer formed on at least a portion of said piezoelectric layer and at least a portion of said inter-digital-transducer.

* * * * *